United States Patent
Han et al.

(10) Patent No.: US 9,337,114 B2
(45) Date of Patent: May 10, 2016

(54) CERAMIC BOARD, METHOD MANUFACTURING THEREOF, IMAGE SENSOR PACKAGE AND METHOD OF MANUFACTURING THE SAME

(75) Inventors: Kwangjoon Han, Seoul (KR); Jaechun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 845 days.

(21) Appl. No.: 13/167,401

(22) Filed: Jun. 23, 2011

(65) Prior Publication Data
US 2011/0317392 A1 Dec. 29, 2011

(30) Foreign Application Priority Data
Jun. 23, 2010 (KR) .................. 10-2010-0059739

(51) Int. Cl.
H05K 7/06 (2006.01)
H01L 23/13 (2006.01)
H01L 23/15 (2006.01)
H01L 23/00 (2006.01)

(52) U.S. Cl.
CPC ............... *H01L 23/13* (2013.01); *H01L 23/15* (2013.01); *H01L 23/562* (2013.01); *H01L 2224/16225* (2013.01); *H01L 2924/09701* (2013.01); *Y10T 29/49124* (2015.01)

(58) Field of Classification Search
CPC ....... H01L 23/13; H01L 23/15; H01L 23/562; H05K 1/0271; H05K 1/03; H05K 1/0306; H05K 3/12; H05K 3/1258; H05K 3/4605; H05K 3/4623; H05K 3/4629; H05K 2201/017; H05K 2201/0195; H05K 7/06; H05K 7/08; H05K 1/115; H05K 1/112; H05K 3/429; H05K 3/4602; H04N 5/2253

USPC ......... 361/790, 761, 735, 729, 737, 807, 760; 174/521, 262
See application file for complete search history.

(56) References Cited

U.S. PATENT DOCUMENTS

| 7,167,376 B2 * | 1/2007 | Miyashita et al. ............ 361/761 |
| 7,530,748 B2 * | 5/2009 | Shibata et al. ............... 396/529 |
| 7,786,573 B2 * | 8/2010 | Choi et al. .................... 257/724 |

(Continued)

FOREIGN PATENT DOCUMENTS

| JP | S-51-044265 | 4/1976 |
| JP | S-54-046371 | 3/1979 |

(Continued)

OTHER PUBLICATIONS

Office Action dated Oct. 27, 2011 in Korean Application No. 10-2010-0059739, filed Jun. 23, 2010.

(Continued)

*Primary Examiner* — Hoa C Nguyen
*Assistant Examiner* — Christopher L Augustin
(74) *Attorney, Agent, or Firm* — Saliwanchik, Lloyd & Eisenschenk (57) ABSTRACT

Disclosed herein is a ceramic board and the manufacturing method and an image sensor package and a manufacturing method thereof, the ceramic board including a ceramic body in which an upper surface is formed with a first groove, a second groove is formed in the first groove, and the second groove is formed with a through hole; a first electrode pad formed in the first groove; and a second electrode pad formed at any one of the upper surface, a lower surface and the both surfaces of the ceramic body, electrically connected to the first electrode pad.

16 Claims, 9 Drawing Sheets

(56) References Cited

U.S. PATENT DOCUMENTS

| | | | |
|---|---|---|---|
| 7,940,467 B2 * | 5/2011 | Berge et al. | 359/665 |
| 8,269,883 B2 * | 9/2012 | Kinoshita | 348/374 |
| 8,988,883 B2 * | 3/2015 | Miyashita | 361/715 |
| 2004/0222352 A1 * | 11/2004 | Nishizawa | 250/208.1 |
| 2006/0169490 A1 * | 8/2006 | Bolken et al. | 174/521 |
| 2006/0251414 A1 * | 11/2006 | Nishizawa | 396/275 |
| 2007/0241273 A1 * | 10/2007 | Kim et al. | 250/239 |
| 2008/0099866 A1 * | 5/2008 | Chang et al. | 257/433 |
| 2009/0079863 A1 * | 3/2009 | Aoki et al. | 348/374 |
| 2009/0090452 A1 * | 4/2009 | Naba et al. | 156/89.11 |
| 2009/0160998 A1 * | 6/2009 | Fukamachi et al. | 348/340 |

FOREIGN PATENT DOCUMENTS

| | | |
|---|---|---|
| JP | 2739366 B2 | 4/1998 |
| JP | 2001-244578 A | 9/2001 |
| JP | 2002-076055 A | 3/2002 |
| JP | 2005-006279 A | 1/2005 |
| JP | 2008-034774 A | 2/2008 |

OTHER PUBLICATIONS

Office Action dated Feb. 17, 2015 in Japanese Application No. 2011-139755.

* cited by examiner

CERAMIC BOARD, METHOD MANUFACTURING THEREOF, IMAGE SENSOR PACKAGE AND METHOD OF MANUFACTURING THE SAME

CROSS-REFERENCE TO RELATED APPLICATION

This application claims the benefit under 35 U.S.C. §119 of Korean Patent Application No. 10-2010-0059739, filed Jun. 23, 2010, which is hereby incorporated by reference in its entirety.

BACKGROUND OF THE DISCLOSURE

1. Field of the Invention

The present invention relates to a ceramic board and the manufacturing method and an image sensor package and a manufacturing method thereof.

2. Description of the Related Art

Generally, a ceramic board is used in a package of active devices such as a semiconductor drive chip, or employed as a package containing passive devices and active devices such as a capacitor, an inductor and a resistor.

That is, a ceramic board is widely used to construct various electronic components such as a module substrate, a switch, a filter, a chip antenna, and each kind of chip package substrate.

In recent years, a ceramic substrate is manufactured in a way that a plurality of ceramic sheets is stacked, by performing a firing process.

At this time, a stacked ceramic sheet is interposed with metal material like an inter-layer electrode line or a via electrode, by which, as a result, a structure may be changed by contraction during firing, and a warpage may occur according to the structure of a stacked ceramic sheet to cause a fault.

BRIEF SUMMARY

The present invention provides a ceramic board including a ceramic body in which an upper surface is formed with a first groove, a second groove is formed in the first groove, and the second groove is formed with a through hole; a first electrode pad formed in the first groove; and a second electrode pad formed at any one of the upper surface, a lower surface and the both surfaces of the ceramic body, electrically connected to the first electrode pad.

The first electrode pad and the second electrode pad may be electrically connected by an electrode line and a conductive via hole formed inside the ceramic body.

Also, the ceramic body may be made by firing.

Also, a width of the through hole may be smaller than that of the second groove, and a width of the second groove may be smaller than that of the first groove.

And, another groove between the first groove and the second groove may be further formed.

In addition, the first groove and the second groove may be connected with an inclined plane.

An area joined with a bottom surface of the first groove and a side surface of the second groove may be tapered off.

The present invention provides an image sensor package using a ceramic board including, a ceramic board containing a ceramic body in which an upper surface is formed with a first groove, a second groove is formed in the first groove, and the second groove is formed with a through hole, a first electrode pad formed in the first groove, and a second electrode pad formed at any one of the upper surface, a lower surface and the both surfaces of the ceramic body, electrically connected to the first electrode pad; and an image sensor chip containing an electrode pad electrically connected to the first electrode pad.

A sealant interposed between the chip and the ceramic board may be further included.

The sealant may be a curable epoxy resin.

An electrode pad of the image sensor chip and the first electrode pad may be electrically connected with a single bump or a stacked bump.

The bump may be an Au bump.

The image sensor chip does not protrude from an upper surface of the ceramic body.

An FPC (Flexible Printed Circuit) electrically connected to the second electrode pad may be further included.

The first and second electrode pads may be electrically connected by an electrode line and a conductive via hole formed inside the ceramic body.

The image sensor chip may receive light of a subject via the through hole.

Another groove between the first groove and the second groove may be further formed.

The present invention provides a manufacture method of a ceramic board including, preparing a first ceramic sheets formed with a first through hole, a second ceramic sheets formed with a second through hole having a larger width than that of the first through hole, and a third ceramic sheets formed with a third through hole having a larger width than the second through hole; sequentially stacking the first ceramic sheets, the second ceramic sheets and the third ceramic sheets; and firing the stacked first through third ceramic sheets.

The first to the third through holes may be communicated, in a state that the first to third sheets are stacked.

A surface of the second ceramic sheet exposed to the third through hole may be formed with a first electrode pad, an upper-most layer ceramic sheet of the third ceramic sheets may be formed with a second electrode pad, electrode lines and conductive via holes for electrically connecting the first electrode pad to the second electrode pad may be formed in the first to third ceramic sheets.

The first to third ceramic sheets are an LTCC (Low Temperature Co-firing Ceramic) for low-temperature firing or an HTCC (High Temperature Cofired Ceramic) for high-temperature firing.

The present invention provides a manufacture method of an image sensor package using a ceramic board, including, preparing a ceramic board containing a ceramic body in which an upper surface is formed with a first groove, a second groove is formed in the first groove, and the second groove is formed with a through hole, a first electrode pad formed in the first groove, and a second electrode pad formed at any one of the upper surface, a lower surface and the both surfaces of the ceramic body, electrically connected to the first electrode pad; forming a bump on an electrode pad of an image sensor chip; and mounting the image sensor chip on the ceramic board by a flipchip bonding of a bump formed onto an electrode pad of the image sensor chip to the first electrode pads.

A step of interposing sealant between the image sensor chip and the ceramic board may be further included, subsequent to mounting the image sensor chip on the ceramic board.

The step of interposing sealant between the image sensor chip and the ceramic board may be a process of applying and curing curable epoxy resin between the image sensor chip and the ceramic board.

The step of preparing the ceramic board may include preparing a first ceramic sheets formed with a first through hole, a second ceramic sheets formed with a second through hole having a larger width than that of the first through hole, and a third ceramic sheets formed with a third through hole having a larger width than that of the second through hole; sequentially stacking the first ceramic sheets, the second ceramic sheets and the third ceramic sheets; and firing the stacked first through third ceramic sheets.

A process of electrically connecting an FPC (Flexible Printed. Circuit) to the second electrode pad may be further included.

The present invention advantageously forms a groove in a ceramic body, so that a chip mounted onto the ceramic body does not a through-hole surrounding area of the ceramic body.

In the end, the present invention beforehand removes a partial area of a ceramic body bent by warpage at firing, to keep the chip from contacting a bent ceramic body when mounted on the ceramic hoard, to inhibit a breakage such as the crack or scratch of a chip and to raise a yield.

Further, the present invention dispenses with unnecessary contacting area existing when a chip is mounted onto a ceramic board, to effectively increase flipchip bonding power.

In addition, the present invention interposes sealant between a chip and a ceramic board, to enhance a strength of a chip that is to be glued to the ceramic board.

DETAILED DESCRIPTION

Hereinafter, described is an embodiment of the present invention in reference to the annexed drawings.

Figure 1:
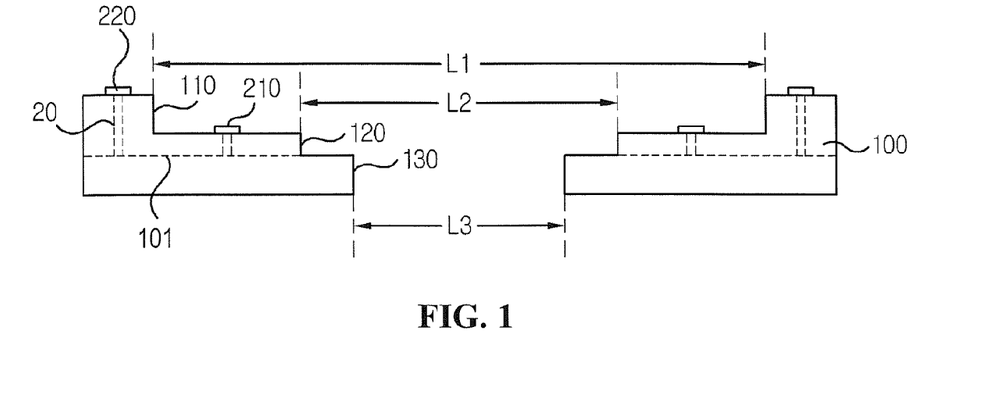
FIG. 1 is a schematic cross-section of a ceramic board according to the invention.

FIG. 1 is a schematic cross-section of a ceramic board according to the present invention.

In the ceramic board, the construction includes a ceramic body 100 wherein an upper surface is formed with a first groove 110, the first groove 110 is formed with the second groove 120, and the second groove 120 is formed with a through hole 130; a first electrode pad 210 formed with the first groove 110; and a second electrode pad 220 formed at the upper surface, the lower surface and any one of both parts, electrically connected to the first electrode pad 210.

Herein, it is preferable that the first and second electrode pads 210, 220 are electrically connected with an electrode line 101 and a conductive via hole 20 formed inside the ceramic body 100.

And, it is preferable that the ceramic body 100 may be made by a firing.

In such constructed ceramic board, the first groove 110 is mounted with a chip, electrically connected to the first electrode pad 210.

Therefore, the first groove 110 is one accommodating the chip.

Also, the second groove 120 is for inhibiting a breakage such as crack or scratch of the chip mounted at the first groove 110, due to occurring warpage, when the ceramic body 100 is cofired.

By this, a ceramic board of the present invention, remarkably decreasing a fault by warpage on a structure, advantageously increases a yield.

Also, the present invention, when a chip is mounted on a ceramic board, does not make any unexpectedly contacting area, resultantly augmenting flipchip bonding power.

And, the chip desires an image sensor chip, and in a case the chip is an image sensor chip, by means of the through hole 130 light of a subject is inputted.

Moreover, preferably, a width L3 of the through hole 130 is smaller than a width L2 of the second groove 120, and the width L2 of the second groove 120 is designed smaller than a width L1 of the first groove 110.

Figure 2:
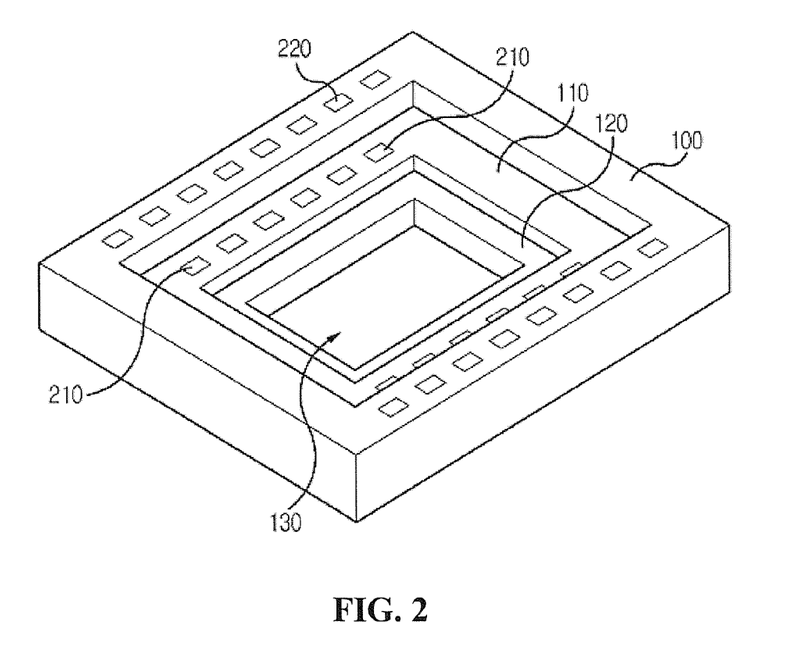
FIG. 2 is a schematic perspective diagram of a ceramic board according to the invention.

FIG. 2 is a schematic prospective diagram of a ceramic board according to the present invention.

A ceramic board according to the present invention, as shown in FIG. 2, may be realized in a rectangular-plate shape, in which having toward a center direction of a rectangular-plate shaped ceramic body 100, a structure of being a first groove 110, a second groove 120, and a through hole 130 sequentially formed.

And, a bottom surface of the first groove 100 may be arranged with $1^{st}$ electrode pads 210, capable of electrically connected with a mounted chip.

Also, the ceramic body 100 upper surface is also formed with $2^{nd}$ electrode pads 220 electrically connected to $1^{st}$ electrode pads 210, enabling electrically connecting to external devices.

Figure 3A:
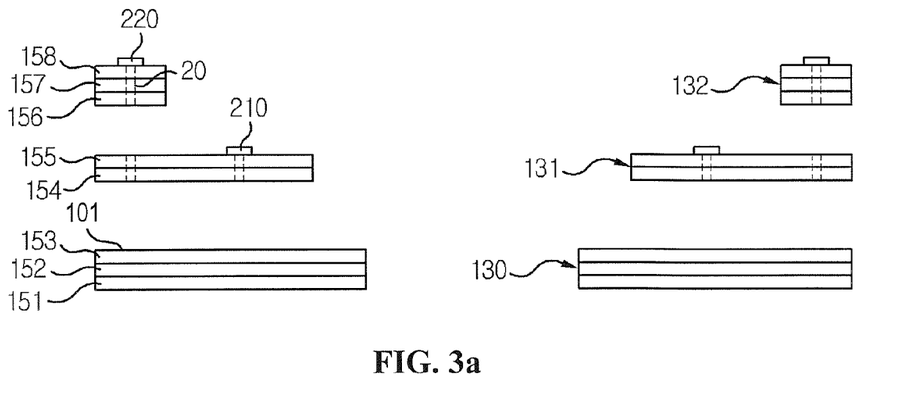
FIGS. 3a through 3c are schematic cross-sections for describing a manufacture method of a ceramic board according to the invention.
Figure 3B:
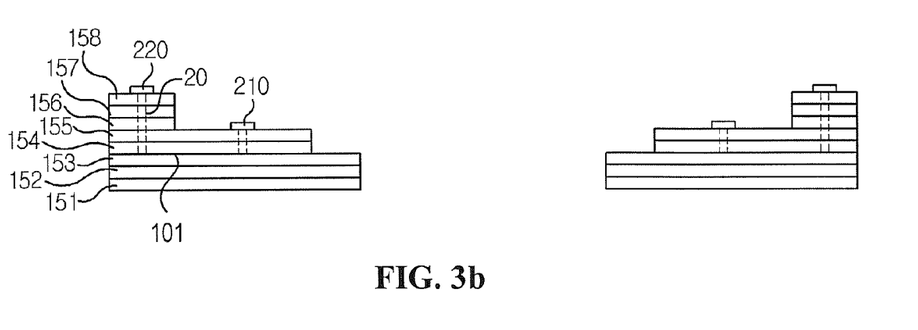
Figure 3C:
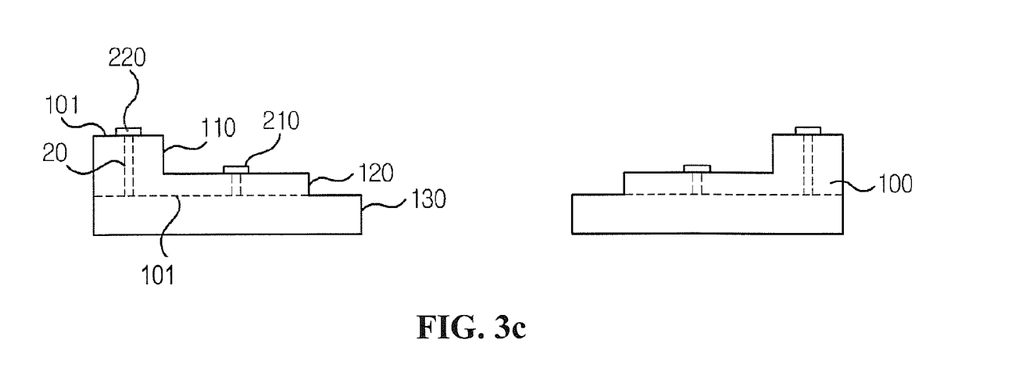

FIGS. 3a and 3c are schematic cross-sections for describing a manufacture method of a ceramic board according to the present invention.

A ceramic board according to the invention is stacked with a plurality of ceramic sheets, and realized by firing the stacked ceramic sheet.

That is, in the description of a manufacture method of a ceramic substrate according to the present invention, first, as shown in FIG. 3a, first ceramic sheets 151, 152, 153 formed with a first through hole 130, and second ceramic sheets 154, 155 formed with a second through hole 131 being a greater width than the through hole 130, and third ceramic sheets 156, 157, 158 formed with a third through hole 132 of greater width than the second through hole 131 are prepared.

Thereafter, the first ceramic sheets 151, 152, 153, the second ceramic sheets 154, 155, and the third ceramic sheets 156, 157, 158 are sequentially stacked. (FIG. 3*b*)

Herein, in a stacked state of the first through third ceramic sheets 151, 152, 153, 154, 155, 156, 157, 158, the first through third through holes 130, 131, 132 are communicated therethrough.

And, a surface of the second ceramic sheet 155 exposed to the third through hole 132 is formed with a first electrode pad 210, an uppermost layer ceramic sheet '158' of the third ceramic sheets 156, 157, 158 is formed with a second electrode pad 220, and electrode lines 101 and conductive via holes 20 for electrically connecting the first electrode pad 210 and the second electrode pad 220 are formed at the first through third sheets 151, 152, 153, 154, 155, 156, 157, 158.

Next, the stacked first through third ceramic sheets 151, 152, 153, 154, 155, 156, 157, 158 are fired. (FIG. 3*c*)

Herein, the first through third ceramic sheets 151, 152, 153, 154, 155, 156, 157, 158 may be applied under an LTCC (Low Temperature Co-firing Ceramic) for low-temperature firing or an HTCC (High Temperature Cofired Ceramic) for high-temperature firing.

By way of conditions, it is preferred that a ceramic board of the present invention is cofired with HTCC.

Figure 4:
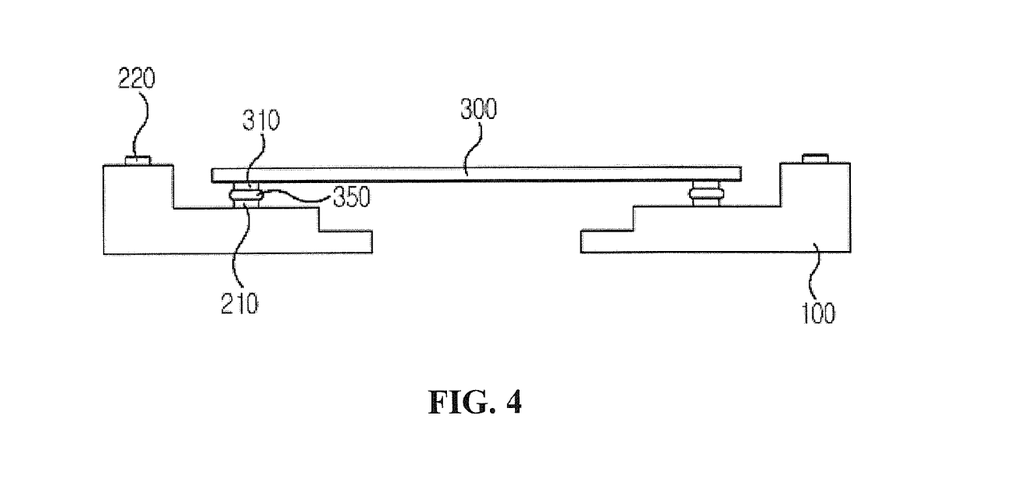
FIG. 4 is a schematic cross-section showing a chip mounted state on a ceramic board according to the invention.

FIG. 4 is a schematic cross-section showing a mounted state of a chip on a to-be-mounted part of a ceramic board according to the invention.

When a ceramic board of the present invention is mounted with a chip, first electrode pads 210 of the ceramic substrate is electrically connected to an electrode pad 310 of a chip 300.

That is, an electrode pad 310 of the chip 300 is formed with a bump 350, the bump 350 formed at the electrode pad 310 of the chip 300 is flipchip bonded to the first electrode pads 210, and the chip 300 is mounted on the ceramic board, thereby electrically connecting 1$^{st}$ electrode pads 210 of the ceramic board with the electrode pad 310 of the chip 300 and simultaneously mounting a chip, so that what is known as a package together with a chip can be fabricated.

Herein, the bump 350 is preferably an Au bump.

Figure 5:
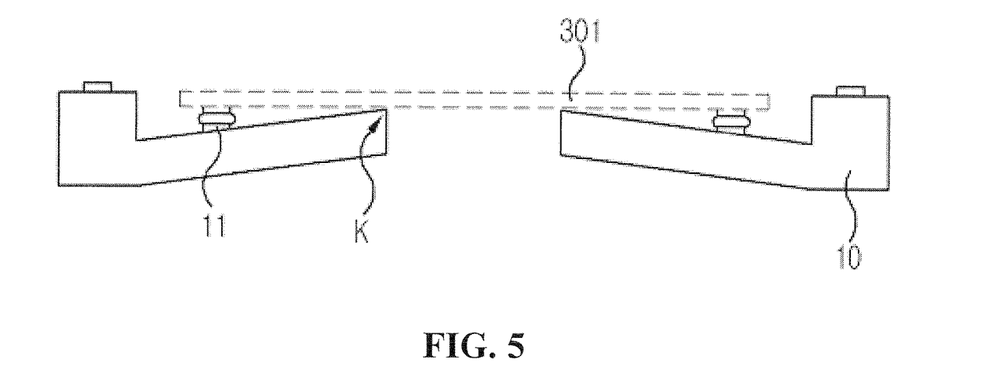
FIG. 5 is a schematic cross-section for describing occurrence of warping at a ceramic board according to a comparative example of the invention.
Figure 6:
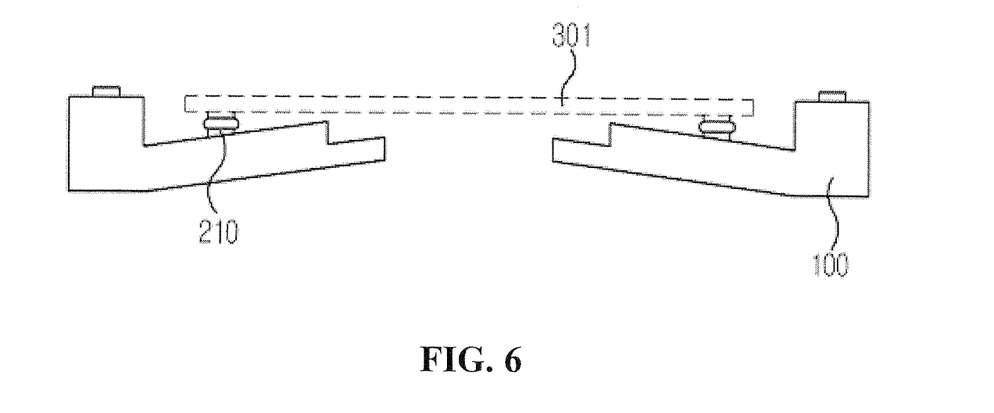
FIG. 6 is a conceptual cross-section for describing occurrence of warping at a ceramic board according to the invention.

FIG. 5 is a conceptual cross-section for describing the occurrence of a warping at a ceramic board according to a comparative example over the invention, and FIG. 6 is a conceptual cross-section for describing the occurrence of a warping at a ceramic board according to the invention.

A ceramic body 10 of a comparative example of the invention is mostly identical with a ceramic body 100 according to the present invention, but the above-described second groove (the drawing signs are not shown) is not provided.

When the ceramic body 10 of such a comparative example and a ceramic body 100 according to the present invention are in firing, a warpage occurs, in which a ceramic body 10 of the comparative example does not have the second groove and by warpage a chip 301 is broken, whereas a ceramic body 100 according to the invention exists with the second groove and thus by warpage the chip 301 is not broken.

That is, as shown in FIG. 5, a surrounding region of a through hole (the drawing numeral is not shown), in the ceramic body 10 of a comparative example, contacts the chip 301 mounted on the ceramic body 10, while in a ceramic body 100 according to the present invention, like FIG. 6, a surrounding region of a through hole 100 does not contact with the chip 301 due to the second groove.

In the end, a ceramic body 100 according to the invention in advance removes the chip 301 contacting area by warpage, thereby inhibiting the breakage of the chip 301.

Figure 7:
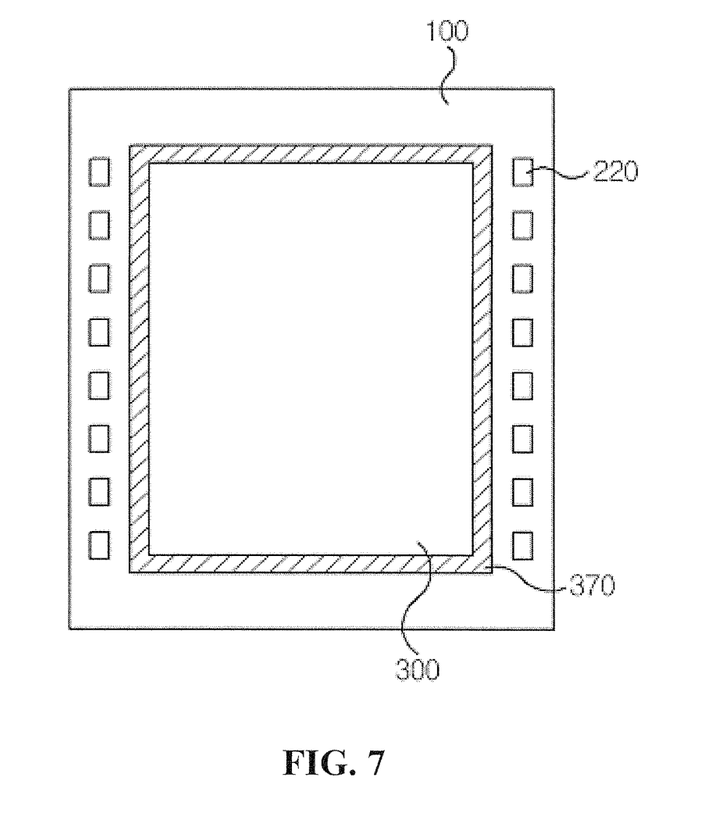
FIG. 7 is a schematic planar view for describing the fixation of a chip mounted on a ceramic board according to the invention.
Figure 8:
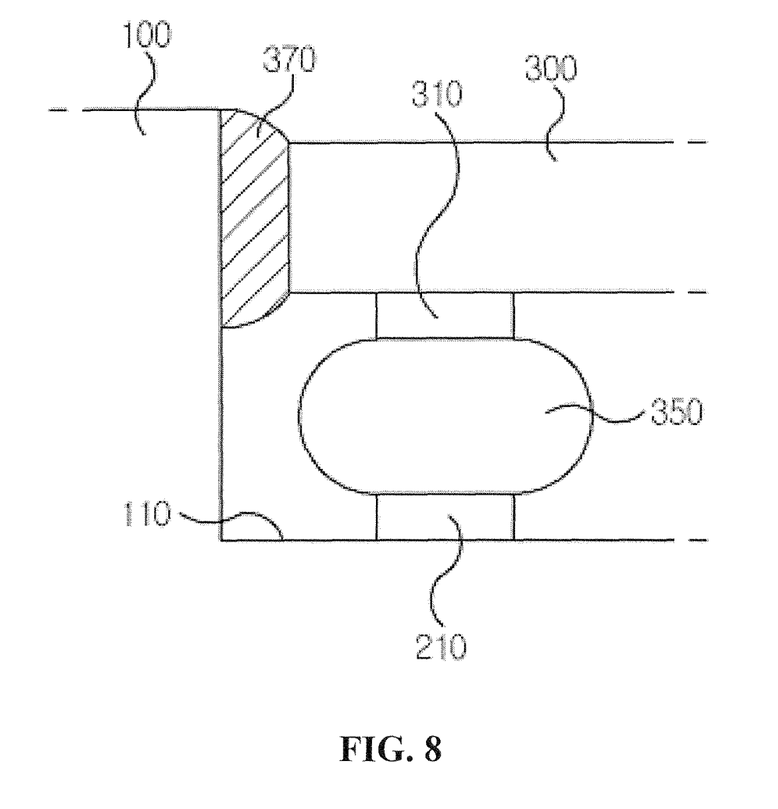
FIG. 8 is a schematic partial cross-section for describing a state of FIG. 7.

FIG. 7 is a schematic planar view for describing the fixation of a chip mounted on a ceramic substrate according to the invention, and FIG. 8 is a schematic partial cross-section for describing a state of FIG. 7.

After a chip 300 is mounted on a ceramic substrate 100, a given interval between the chip 300 and the ceramic board 100 exists.

And, since the chip 300 is bonded with bump to first electrode pads (the drawing numeral is not shown) of the ceramic substrate 100, the chip 300 depends on a bonding power of bump regarding a force fixed to the ceramic board 100.

Therefore, since even in a small external force, the bump has high possibility of exfoliating from the chip 300 and the ceramic board 100, the chip 300 can easily leave away from the ceramic board 100.

Therefore, the present invention may interpose sealant 370 between the chip 300 and the ceramic board 100, thereby enhancing a strength of the chip 300 gluing to the ceramic substrate 100.

And, the sealant 370 may applied with curable epoxy resin, capable of curing the spread sealant 370. At this time, the curable epoxy resin is preferably thermosetting epoxy resins.

Figure 9:
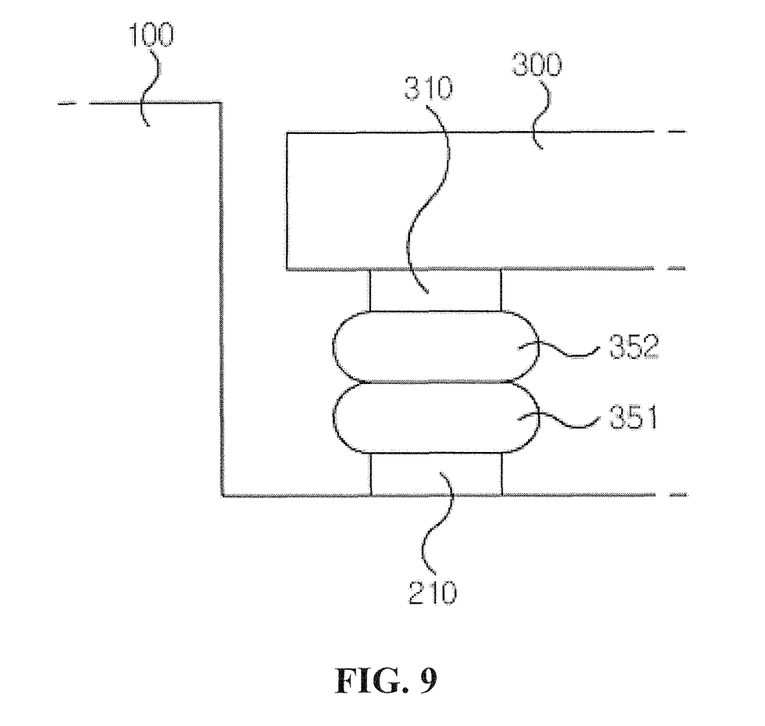
FIG. 9 is a schematic partial cross-section showing one example of a state that a chip is mounted on a ceramic board according to the invention.

FIG. 9 is a schematic partial cross-section showing one example of a state that a chip is mounted on a ceramic board according to the invention.

In the above description, it was stressed that a chip 300's mounting on a ceramic board 100 is preferably performed by a flipchip bonding.

At this time, before the chip 300 is mounted on the ceramic substrate 100, a bump is fused on an electrode pad 310 of the chip 300, in which the fused bump may be a single bump or stacked bump.

That is, as shown in FIG. 9, between an electrode pad 310 of the chip 300 and a first electrode pad 210 of the ceramic board 100 may be interposed with a bump stacked by a first bump 351 and a second bump 352.

Such a stacked bump may inhibit the chip 300 from contacting the ceramic board 100, by warpage of the ceramic substrate 100.

Figure 10:
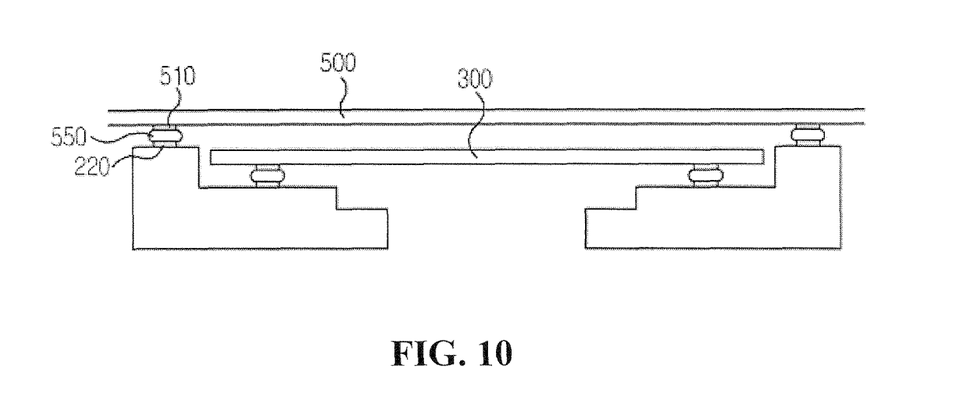
FIG. 10 is a schematic cross-section showing a state that an FPC (Flexible Printed Circuit) is bonded to a ceramic board according to the invention.

FIG. 10 is a schematic cross-section showing a state that an FPC (Flexible Printed Circuit) is bonded to a ceramic substrate according to the invention.

After a ceramic body 100 of a ceramic board is mounted with a chip 300, a second electrode pad 220 formed on the ceramic body 100 may be electrically connected with an FPC 500.

The FPC 500 is for delivering a power supply to the chip 300 mounted on the ceramic body 100 and sending a signal generated in the chip 300 to an external device, and FIG. 10 shows an appearance that an electrode pad 510 of the FPC 500 is bonded to the second electrode pad 220 by bump 550.

At this time, the mounted chip 300 is well advised not to protrude from an upper surface of the ceramic body 100.

That is, this is because when the mounted chip 300 is protruded from an upper surface of the ceramic body 100, the FPC 500 electrically connects with the ceramic body 100 and thus contacts the chip 300, causing damage to the chip 300.

Figure 11:
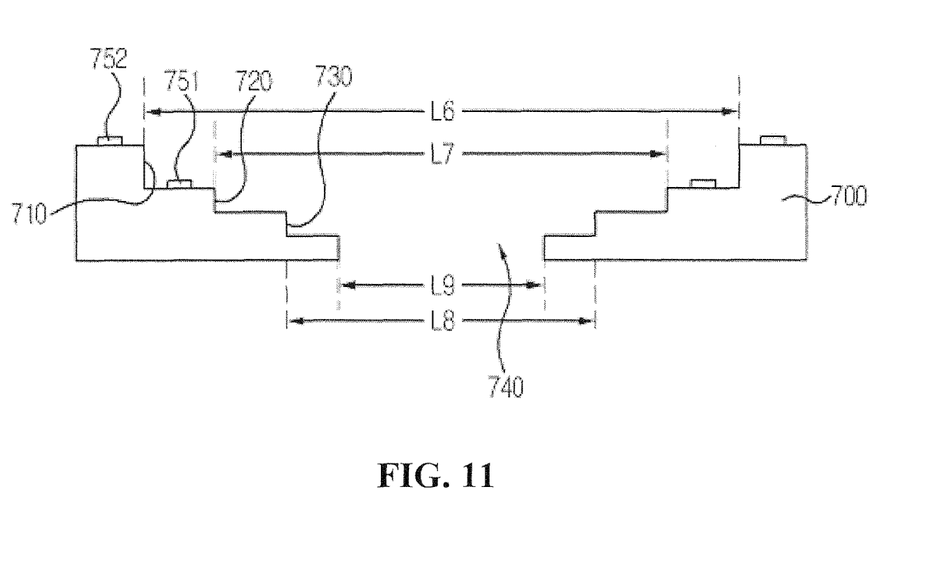
FIG. 11 is a schematic cross-section for describing a ceramic board of another example of the invention.

FIG. 11 is a schematic cross-section for describing a ceramic board of another embodiment of the present invention.

A ceramic board of another embodiment of the invention has a groove for more effectively inhibiting damage to a chip due to warpage of a ceramic body.

That is, a ceramic board of another embodiment of the invention with its construction includes a ceramic body 700 in which an upper surface is formed with a first grove 710, inside the first groove 710 is formed a second groove 720, and the second groove 720 is formed with a third groove 730, and the third groove 730 is formed with a through hole 740; a first electrode pad 751 formed at the first groove 710; a second electrode pad 752 formed at any one of an upper surface, a lower surface and both parts of the ceramic body 700, electrically connected to the first electrode pad 751.

And, in an order of the first groove 710's width L6, the second groove 720's width L7, the third groove 730's width L8 and a width L9 of the through hole 740, a width is great. (L6>L7>L8>L9)

Thus, in a ceramic board of an embodiment shown in FIG. 11, compared with a ceramic substrate of an embodiment shown in FIG. 1, a ceramic body 700 area bent by warpage can be removed by the third groove 730, remarkably inhibiting a breakage of a chip.

Figure 12A:
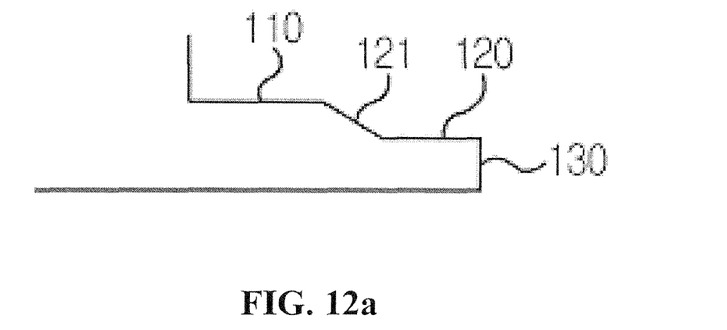
FIGS. 12a and 12b are schematic partial cross-section for describing other examples of a ceramic board according to the invention.
Figure 12B:
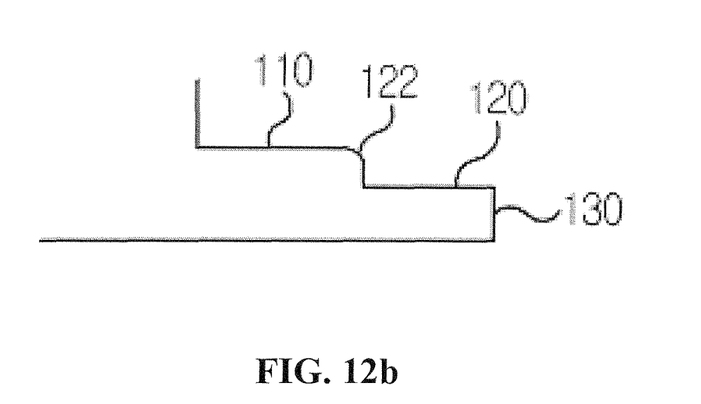

FIGS. 12a and 12b are schematic partial cross-section for describing other examples of a ceramic board according to the invention.

In a ceramic board of an embodiment shown in FIG. 1, a first groove 110 and a second groove 120 may be constructed to connect by an inclined surface 121, resultantly decreasing possible contact with a chip.

And, an area encountering with a bottom surface of the first groove 110 and a side surface of the second groove 120 may be taper-worked, so that a contact area of a chip can be removed or by reasoning of not sharpening when contacted with the chip a breakage of a chip may be lessen.

That is, FIG. 12b shows a taper process area '122'.

While the present invention has been described in detail through representative embodiments in the above part, it would be understood by those skilled in the art that various modifications and variations can be made within a spirit and a scope of the invention, and they pertain to the annexed claims.

What is claimed is:

1. A ceramic board, comprising:
   a ceramic body having a first groove depressed from an upper surface of the ceramic body and a second groove depressed from a bottom surface of the first groove, wherein the first groove accommodates an image sensor chip therein, and wherein the second groove is formed with a through hole;
   a first electrode pad formed at a bottom surface of the first groove; and
   a second electrode pad formed on the upper surface of the ceramic body, electrically connected to the first electrode pad;
   wherein an edge between the first groove and the second groove has a curved shape,
   wherein the second groove remains empty while the first groove accommodates the image sensor chip, and
   wherein the through hole remains empty such that the second groove and the through hole form a continuous empty space.

2. The ceramic board as claimed in claim 1, wherein the first electrode pad and the second electrode pad are electrically connected by an electrode line and a conductive via hole formed inside the ceramic body.

3. The ceramic board as claimed in claim 1, wherein a width of the through hole is smaller than that of the second groove, and a width of the second groove is smaller than that of the first groove.

4. The ceramic board as claimed in claim 1, wherein an area joined with the bottom surface of the first groove and a side surface of the second groove is tapered off.

5. An image sensor package using a ceramic board, the image sensor package comprising:
   a ceramic board comprising:
   a ceramic body having a first groove depressed from an upper surface of the ceramic body and a second groove depressed from a bottom surface of the first groove, wherein the first groove accommodates an image sensor chip therein, wherein the second groove is formed with a through hole, and wherein an edge between the first groove and the second groove has a curved shape;
   a first electrode pad formed on the bottom surface of the first groove; and
   a second electrode pad formed on the upper surface of the ceramic body, electrically connected to the first electrode pad; and
   the image sensor chip comprising a third electrode pad electrically connected to the first electrode pad;
   wherein the second groove is formed by being recessed on the bottom surface of the first groove,
   wherein the second groove remains empty while the first groove accommodates the image sensor chip, and
   wherein the through hole remains empty such that the second groove and the through hole form a continuous empty space.

6. The image sensor package as claimed in claim 5, wherein a sealant interposed between the chip and the ceramic board is further included.

7. The image sensor package as claimed in claim 6, wherein the sealant is a curable epoxy resin.

8. The image sensor package as claimed in claim 5, wherein an electrode pad of the image sensor chip and the first electrode pad are electrically connected with a single bump or a stacked bump.

9. The image sensor package as claimed in claim 8, wherein the bump is an Au bump.

10. The image sensor package as claimed in claim 5, wherein the image sensor chip does not protrude from an upper surface of the ceramic body.

11. The image sensor package as claimed in claim 5, wherein an FPC (Flexible Printed Circuit) electrically connected to the second electrode pad is further included.

12. The image sensor package as claimed in claim 5, wherein the first and second electrode pads are electrically connected by an electrode line and a conductive via hole formed inside the ceramic body.

13. The image sensor package as claimed in claim 5, wherein the image sensor chip receives light of a subject via the through hole.

14. The image sensor package as claimed in claim 5, wherein a groove between the first groove and the second groove is further formed.

15. The ceramic board as claimed in claim 1, further comprising a third groove formed by being recessed on the bottom surface of the second groove.

16. The ceramic board as claimed in claim 1, wherein the first groove and the second groove are connected by an inclined surface.

* * * * *